(12) United States Patent
Chen et al.

(10) Patent No.: US 9,331,142 B2
(45) Date of Patent: May 3, 2016

(54) ZENER DIODE HAVING A POLYSILICON LAYER FOR IMPROVED REVERSE SURGE CAPABILITY AND DECREASED LEAKAGE CURRENT

(71) Applicant: Vishay General Semiconductor LLC, Hauppauge, NY (US)

(72) Inventors: Shih-Kuan Chen, Taipei (TW); Wan-Lan Chiang, Taipei (TW); Ming-Tai Chiang, Taipei (TW); Chih-Ping Peng, Taipei (TW); Yih-Yin Lin, Taipei (TW)

(73) Assignee: VISHAY GENERAL SEMICONDUCTOR LLC, Hauppauge, NY (US)

( * ) Notice: Subject to any disclaimer, the term of this patent is extended or adjusted under 35 U.S.C. 154(b) by 0 days.

(21) Appl. No.: 14/819,826

(22) Filed: Aug. 6, 2015

(65) Prior Publication Data

US 2015/0340458 A1    Nov. 26, 2015

Related U.S. Application Data

(62) Division of application No. 14/043,431, filed on Oct. 1, 2013, now Pat. No. 9,202,935.

(51) Int. Cl.

| H01L 21/425 | (2006.01) |
|---|---|
| H01L 29/06 | (2006.01) |
| H01L 29/861 | (2006.01) |
| H01L 29/66 | (2006.01) |
| H01L 21/265 | (2006.01) |
| H01L 21/283 | (2006.01) |
| H01L 21/225 | (2006.01) |
| H01L 29/866 | (2006.01) |

(52) U.S. Cl.
CPC ........ *H01L 29/0611* (2013.01); *H01L 21/2253* (2013.01); *H01L 21/2257* (2013.01); *H01L 21/2652* (2013.01); *H01L 21/283* (2013.01); *H01L 29/66106* (2013.01); *H01L 29/66113* (2013.01); *H01L 29/861* (2013.01); *H01L 29/866* (2013.01)

(58) Field of Classification Search
USPC .......................................... 438/514
See application file for complete search history.

(56) References Cited

U.S. PATENT DOCUMENTS

| 4,775,643 A | 10/1988 | Wetteroth |
|---|---|---|
| 5,612,568 A | 3/1997 | Arai |

(Continued)

FOREIGN PATENT DOCUMENTS

| JP | 08-064843 | 3/1996 |
|---|---|---|
| JP | 2012-174894 | 9/2012 |
| KR | 10-2009-0015719 | 2/2009 |

*Primary Examiner* — Timor Karimy
(74) *Attorney, Agent, or Firm* — Stuart H. Mayer; Mayer & Williams PC

(57) ABSTRACT

A semiconductor device such as a Zener diode includes a first semiconductor material of a first conductivity type and a second semiconductor material of a second conductivity type in contact with the first semiconductor material to form a junction therebetween. A first oxide layer is disposed over a portion of the second semiconductor material such that a remaining portion of the second semiconductor material is exposed. A polysilicon layer is disposed on the exposed portion of the second semiconductor material and a portion of the first oxide layer. A first conductive layer is disposed on the polysilicon layer. A second conductive layer is disposed on a surface of the first semiconductor material opposing a surface of the first semiconductor material in contact with the second semiconductor material.

7 Claims, 4 Drawing Sheets

(56) References Cited

U.S. PATENT DOCUMENTS

| | | |
|---|---|---|
| 5,736,779 A | 4/1998 | Kobayashi |
| 6,791,161 B2 | 9/2004 | Hamerski |
| 7,012,276 B2 | 3/2006 | Kingsborough et al. |
| 7,582,537 B2 | 9/2009 | Song et al. |
| 8,198,703 B2 | 6/2012 | Lin et al. |
| 2008/0121988 A1 | 5/2008 | Mallikararjunaswamy et al. |
| 2008/0258224 A1 | 10/2008 | Hshieh |
| 2010/0237414 A1 | 9/2010 | Hsieh |

ZENER DIODE HAVING A POLYSILICON LAYER FOR IMPROVED REVERSE SURGE CAPABILITY AND DECREASED LEAKAGE CURRENT

CROSS REFERENCE TO RELATED APPLICATION

This application is a divisional of U.S. application Ser. No. 14/043,431, filed Oct. 1, 2013, the contents of which are incorporated herein by reference.

BACKGROUND

Zener diodes are two-terminal electronic devices which act as conventional diodes when forward-biased, i.e., with unidirectional conduction, but when reverse-biased above a certain threshold voltage, conduct in the reverse direction. The term "Zener diode" is traditionally applied to devices comprised of p-n junctions formed in conventional semiconductor materials, e.g., Si, which junctions undergo avalanche breakdown at reverse bias potentials above about 5 volts, for example, and such devices may be utilized in voltage regulating and circuit protection circuitry.

A current (I) vs. voltage (V) plot of an idealized Zener diode is illustrated in FIG. 1, from which it is evident that, when reverse-biased above a certain voltage, i.e., the Zener threshold voltage, generally above 5 V, for example, for Si-based devices, a sudden rise in the reverse current occurs. Thus, when forward-biased, a Zener diode functions as an ordinary rectifier, but, when reverse-biased, exhibits a knee, or sharp break, in its I-V plot. A characteristic of Zener avalanche or breakdown is that once conduction occurs under reverse-bias, the voltage across the device remains essentially constant upon further increase of reverse current, up to a maximum allowable dissipation rating. As a consequence of this characteristic behavior, Zener diodes find utility, inter alia, as voltage regulators, voltage references, and overvoltage protectors.

During a surge event, it is desired to limit the voltage drop across the device to a minimum value. Accordingly, an important characteristic of a Zener diode is its reverse surge capability.

SUMMARY

In accordance with one aspect of the invention, a semiconductor device such as a Zener diode is provided. The semiconductor device includes a first semiconductor material of a first conductivity type and a second semiconductor material of a second conductivity type in contact with the first semiconductor material to form a junction therebetween. A first oxide layer is disposed over a portion of the second semiconductor material such that a remaining portion of the second semiconductor material is exposed. A polysilicon layer is disposed on the exposed portion of the second semiconductor material and a portion of the first oxide layer. A first conductive layer is disposed on the polysilicon layer. A second conductive layer is disposed on a surface of the first semiconductor material opposing a surface of the first semiconductor material in contact with the second semiconductor material.

In accordance with another aspect of the invention, a method is provided of fabricating a semiconductor device. The method includes forming a first oxide layer over a portion of a semiconductor substrate formed from a first semiconductor material having a first conductivity type such that a remaining portion of the semiconductor substrate is exposed. A protective layer is formed on a first surface of the semiconductor substrate and the first oxide layer. A dopant of the second conductivity type is introduced into the semiconductor substrate through the protective layer to form a junction layer that defines a junction with the semiconductor substrate. A first conductive layer is formed over the junction layer. A second conductive layer is formed on a second surface of the semiconductor substrate opposing the first a surface of the semiconductor substrate.

DETAILED DESCRIPTION

As detailed below, a Zener diode is provided which has an improved reverse surge capability and a reduced leakage current. Although this improvement will be described in terms of one illustrative Zener diode design, the methods and techniques described herein are equally applicable to a wide variety of Zener diode configurations as well as other types of transient voltage suppressors.

Figure 1:
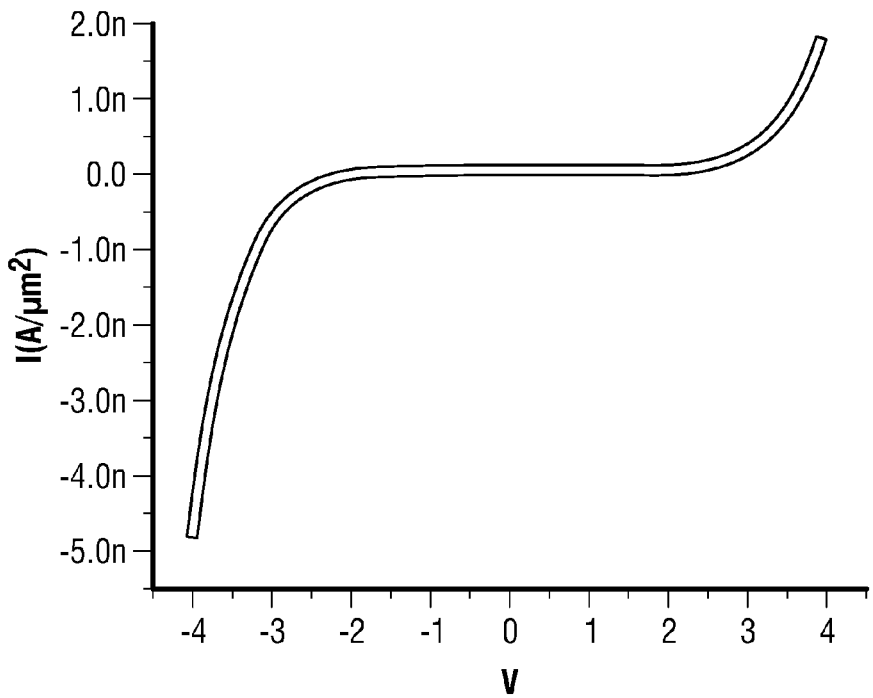
FIG. 1 shows a current (I) vs. voltage (V) plot of an idealized Zener diode.
Figure 2:
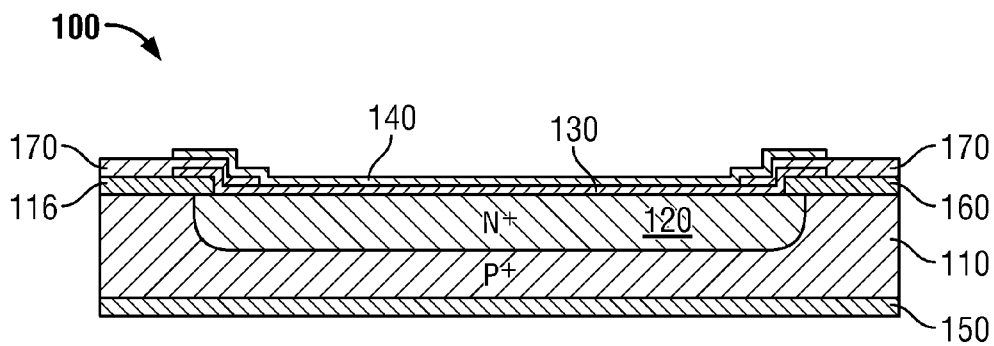
FIG. 2 shows one example of a Zener diode having an improved reverse surge capability and a reduced leakage current.

FIG. 2 shows one example of a Zener diode having an improved reverse surge capability. As shown Zener diode 100 includes a semiconductor substrate 110 heavily doped with a dopant of a first conductivity type, which in this example is a P-type dopant. A junction layer 120 of a second conductivity type is formed in the substrate 110. In this example the junction layer 120 has an N+-type conductivity. A P-N junction is located at the interface between the semiconductor substrate 110 and the junction layer 120. A polysilicon layer 130 is disposed on the junction layer. A first conductive material 140 that serves as an electrode is disposed on the polysilicon layer 130. Likewise, a second conductive material 150 that also serves as an electrode is disposed on a back surface of the substrate 110. The Zener diode 100 also includes a first oxide layer 160 disposed on the substrate 110 and which is formed and etched as part of the photolithographic process used to form the junction layer 120. In addition, a second oxide layer 170, such as a low temperature oxide (LTO), a first portion of which is disposed on the first oxide layer 160 and a second portion of which is interposed between the polysilicon layer 130 and the first conductive material 140. The second oxide layer 170 is formed and etched as part of the photolithographic process used to form the first conductive material 140.

During the fabrication process of the Zener diode show in FIG. 2, the polysilicon layer 130 is advantageously formed prior to junction layer 120. An implantation or other doping process is then used to deposit a dopant onto the polysilicon layer 130. A subsequent thermal process is applied to drive the dopant through the polysilicon layer 130 and into the substrate 110. The use of the polysilicon layer 130 in this manner has been found to improve both the reverse surge capability and the leakage current of the Zener diode.

Without being bound by any theory of operation, the polysilicon layer is believed to reduce defects that are created by the doping process used to form the junction layer 120. When the dopants are directly introduced into the substrate 110 by implantation or the like, defects are typically created to a certain depth within the substrate. These defects may adversely impact the reverse surge performance and the leakage current of the resulting device. By introducing the dopant onto and through a polysilicon layer, however, defects in the substrate can be reduced.

One example of a process that may be used to fabricate the Zener diode shown in FIG. 2 is described below in connection with FIGS. 3-9.

Figure 3:
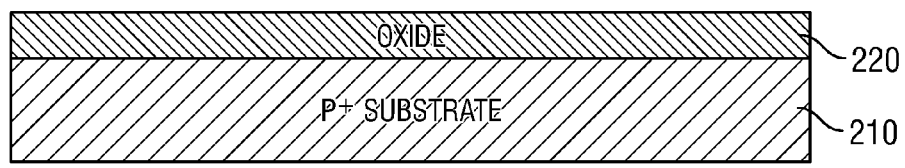
FIGS. 3-9 show one example of a sequence of process steps that may be employed to fabricate the Zener diode shown in FIG. 2.

FIG. 3 is a cross sectional view of a semiconductor substrate and an oxide layer. In one embodiment, substrate 210 is a low resistivity, $P^+$-type <111> orientation monocrystalline silicon having a resistivity in the range of approximately $1 \times 10^{-3}$ ohm-cm to $5 \times 10^{-3}$ ohm-cm. The silicon crystal lattice orientation can be optionally <100>. In an alternative embodiment, substrate 210 is comprised of other types of semiconductor material, such as gallium arsenide. Further, it is understood that an N-type substrate can also be used with corresponding adjustments to the fabrication process. In one embodiment, the P+-type silicon substrate is doped with boron. Of course, it is understood that other dopants can also be used in the alternative.

Next, an oxide layer 220 is formed. In one embodiment oxide layer 220 may be produced by exposing the wafer to an environment of approximately 1000° C. for about 200 minutes and to approximately 1200° C. for an additional 200 minutes. During this time the heated semiconductor materials are exposed to a mixture of nitrogen and oxygen gas. In one embodiment, a layer of silicon dioxide ranging in thickness from about 1400 angstroms to about 1800 angstroms is grown on the surface of the structure. It is understood that other processes for forming an oxide layer can be used in connection with the present invention. Further, the oxide layer can be of a different thickness.

Figure 4:
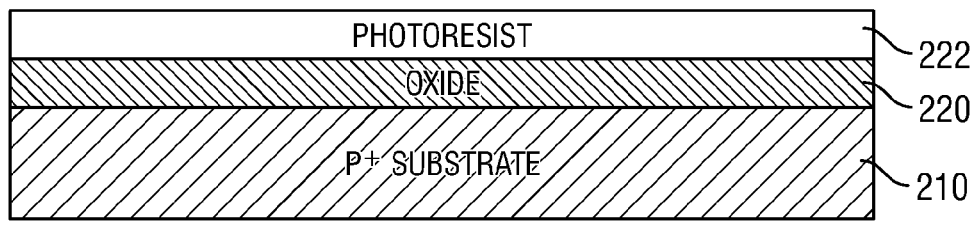

Next, a photolithography step is performed to create an opening in the oxide layer. First, as shown in FIG. 4, a photoresist material 222 is applied to the surface of the oxide layer 220. In one embodiment, the photoresist is applied at a thickness of about 1.3 microns. The photoresist material 222 is exposed to light through a pattern mask, and the exposed portions of the photoresist material are then removed from the surface of the oxide layer. In one embodiment, the oxide is etched from the surface of the structure using a Reactive Ion Etching ("RIE") technique according to the pattern detail that was transferred to the photoresist. It is also understood that other oxide etching process can be used as an alternative to a reactive ion etching process. Oxide regions under the photoresist covered areas are not removed in the etching process.

Figure 5:
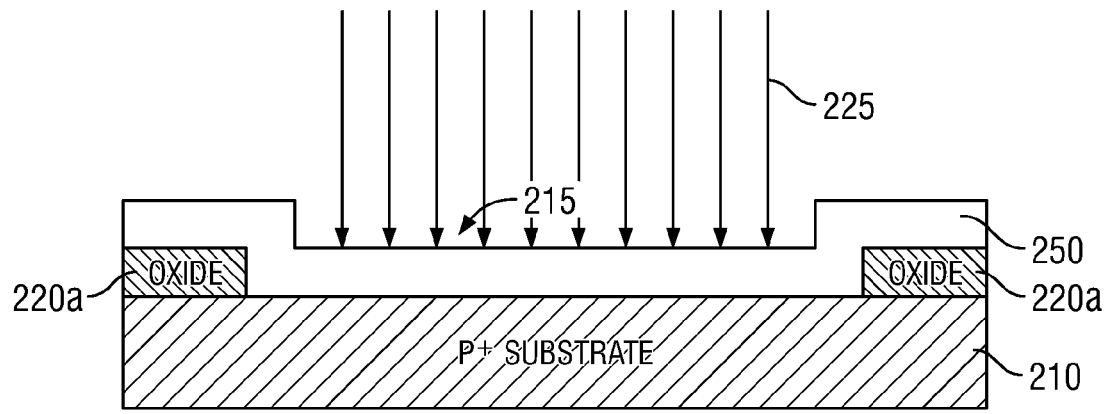

As shown in FIG. 5, the center portion of the oxide layer 220 is etched as described above to form window 215. Sections 220a correspond to the portions of oxide layer 220 that have not been etched. In one embodiment, the remaining photoresist is removed from the wafer with a photoresist stripping solution before the next step. Polysilicon, which may be undoped, is next deposited over the substrate 210 and at least a portion of the oxide layer 220a to form polysilicon layer 250. In some embodiments polysilicon layer 250 may have a thickness between 1 and 4 microns.

An ion implantation process is next performed. The remaining oxide that has not been etched away forms a hard mask to prevent ions from passing therethrough so that they do not enter the substrate 210. In some cases, the remaining photoresist material, approximately 1.3 microns thick, may be left on the wafer until after the ion implantation procedure to aid the oxide in absorption of ions in the region outside of the exposed window.

Figure 6:
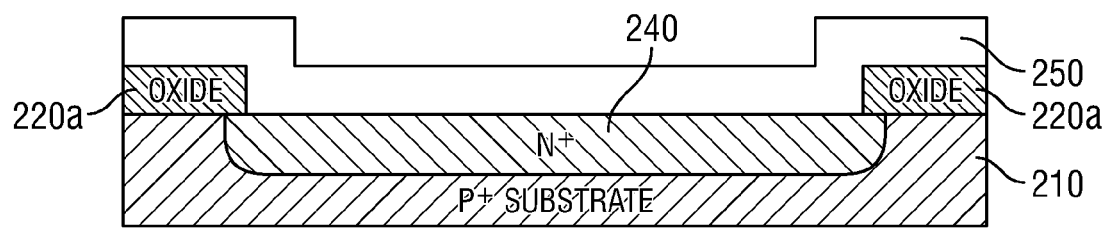

The ion implantation process is indicated in FIG. 5 by arrows 225. The arrows 225 represent an N+-type dopant such as phosphorous or arsenic that is introduced onto the polysilicon layer 250. In one embodiment, the N+-type dopant is introduced using ion implantation of phosphorous at a dose of $1.72 \times 10^{13}$ ions/cm$^2$ at an energy of 140 KeV, forming a layer approximately 1 micron deep. In an alternative embodiment, a significantly lower energy may be used in the ion implantation process. A subsequent diffusion step is performed at elevated temperatures to drive the implanted ions further into the substrate 210, thereby forming the N+-type junction layer 240 as shown in FIG. 6.

Figure 7:
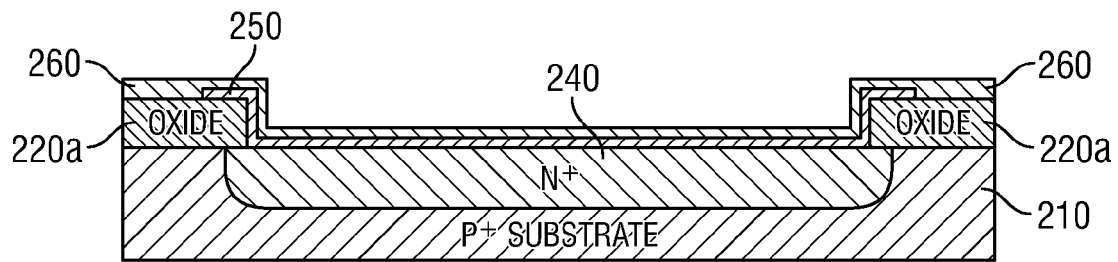

As shown in FIG. 7, an oxide layer 260 is formed over the polysilicon layer 250. In some embodiments the oxide layer 260 is a low temperature oxide (LTO) layer 260.

Figure 8:
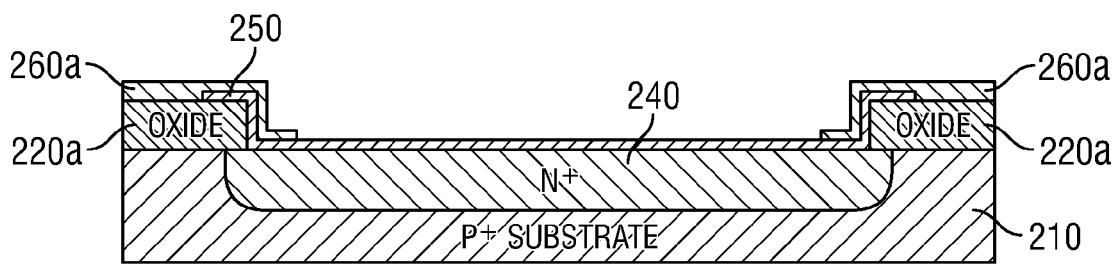
Figure 9:
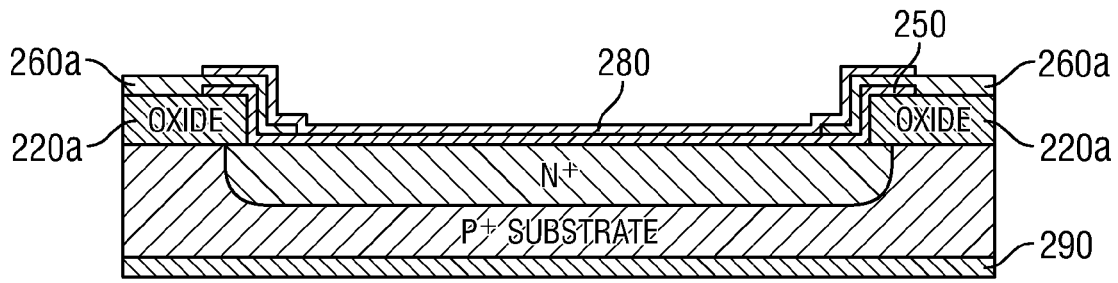

FIG. 8 shows the sections 260a of the LTO layer 260 after being etched using a photolithographic technique as described above to form an opening for the deposition of an optional passivation layer (not shown) and a conductive material. The conductive material 280, which is shown in FIG. 9, may be a suitable metal such as silver, for example. The conductive material 280 is formed over the portion of the polysilicon layer 250 exposed by the opening in the LTO layer 260. Conductive material 280 is also formed over the sections 260a of the LTO layer 260.

A series of Zener diodes were manufactured using a polysilicon layer of different thicknesses to demonstrate the improvements in the reverse surge capability and leakage current that can be achieved. The results are shown in Table 1 for a series of 5 V diodes and a series of 7V diodes. Three samples were manufactured in each series, one with no polysilicon which serves as a control, one with a polysilicon layer 1 micron in thickness and one with a polysilicon layer 2 microns thick. The minimum, average and maximum reverse surge capability and leakage current were measured for each device. As Table 1 shows, the reverse surge capability increases as the polysilicon thickness increases. Likewise, the leakage current decreases as the polysilicon thickness increases, thereby completing the device structure.

TABLE 1

| Sample No. | Voltage (Vwm) | Design Poly Si Thickness (um) | Surge 10 × 1000 (Watt) | | | Ir @ Vwm (uA) | | |
|---|---|---|---|---|---|---|---|---|
| | | | Min | Ave | Max | Min | Ave | Max |
| 1 | 5 V | No | 548 | 615 | 696 | 26.0 | 38.5 | 81.7 |
| 2 | 5 V | 1 um | 601 | 661 | 726 | 18.0 | 19.8 | 22.3 |
| 3 | 5 V | 2 um | 666 | 698 | 710 | 2.7 | 3.2 | 3.7 |
| 4 | 7 V | No | 441 | 565 | 657 | 3.5 | 3.7 | 5.6 |
| 5 | 7 V | 1 um | 521 | 611 | 704 | 2.7 | 3.2 | 3.8 |
| 6 | 7 V | 2 um | 618 | 668 | 711 | 2.7 | 3.1 | 3.7 |

Zener diodes were also manufactured with polysilicon layers thicker than 2 microns. For these devices the reverse surge capability was found to decrease as polysilicon thickness increases beyond two microns. This is presumably because of poor thermal dissipation caused by the polysilicon layer. Accordingly, the trade-off between fewer junction defects and poor heat dissipation resulted in an optimal polysilicon thickness of about 1 to 2 um for the 5 and 7 V Zener diodes.

However, for these same devices the leakage current continued to decrease as the polysilicon layer thickness increased to 4 um, which was the sample test thickness limit. The leakage current for the devices with a 4 um thick polysilicon layer was reduced to less than one-tenth of the leakage current of the control sample. Accordingly, for some low voltage diode embodiments, a polysilicon layer thickness of 1-4 um, and more particularly a layer thickness of 1-2 um, may provide a significant increase in the reverse surge capability as well as a decrease in the leakage current.

Figure 10:
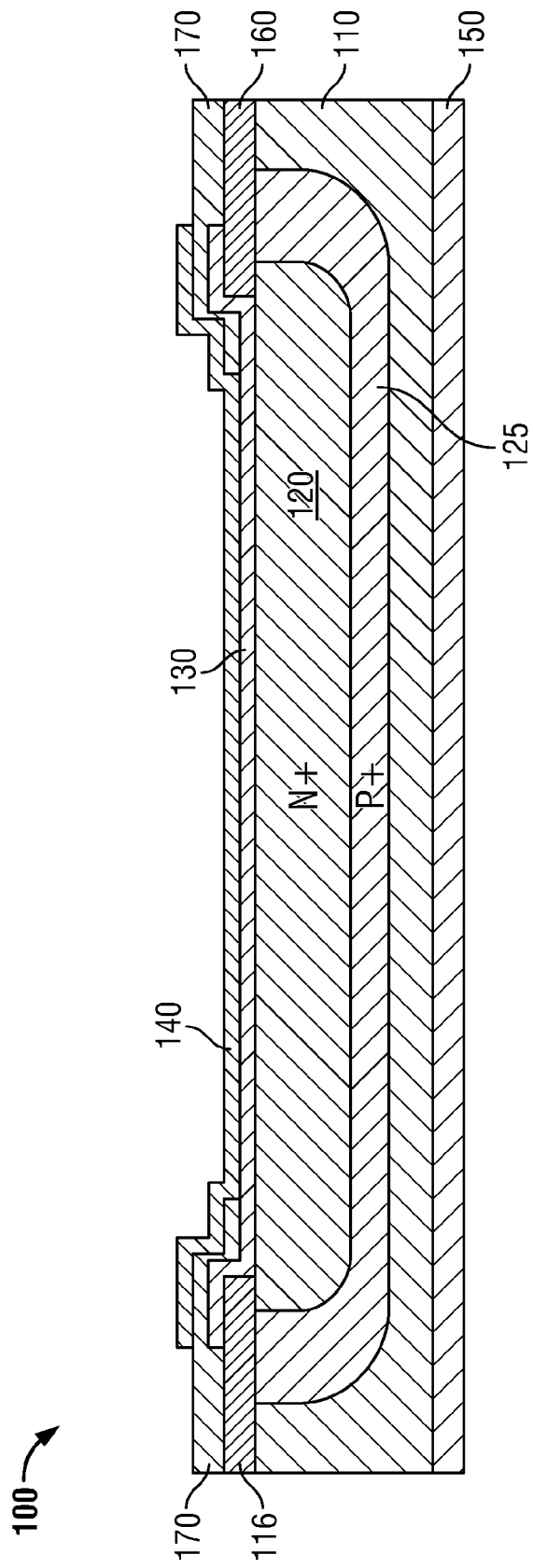
FIG. 10 shows another example of a Zener diode having an improved reverse surge capability and a reduced leakage current.

Those of ordinary skill in the art will recognize that the use of a polysilicon layer to improve the reverse surge capability is applicable to devices having different configurations and compositions from that described above. Moreover, different fabrication techniques from those described above may be employed to manufacture the devices. For instance, As shown in FIG. 10, in one alternative embodiment, instead of using the semiconductor substrate 110 as one of the pair of semiconductor layers that form the P-N junction, both layers 120 and 125 that define the P-N junction may be formed in the semiconductor substrate 110 by ion implantation or the like. In FIGS. 2 and 10, like elements are denoted by like reference numerals.

In other embodiments, a material other than polysilicon may be used to form the layer through which the dopants are introduced to form the junction layer. Any appropriate material may be employed which can serve as a protective layer protecting the substrate surface from damage arising during the doping process, without also forming a barrier to dopant diffusion. An advantage of using a material such as polysilicon, which is electrically conducting, is that it does not need to be removed after completion of the doping process. For instance, while an oxide layer may be used instead of a polysilicon layer, the oxide layer will need to be removed after the structure is doped since it is not an electrically conducting material.

While exemplary embodiments and particular applications of this invention have been shown and described, it is apparent that many other modifications and applications of this invention are possible without departing from the inventive concepts herein disclosed. It is, therefore, to be understood that, within the scope of the appended claims, this invention may be practiced otherwise than as specifically described, and the invention is not to be restricted except in the spirit of the appended claims. Though some of the features of the invention may be claimed in dependency, each feature may have merit if used independently.

The invention claimed is:

1. A method of fabricating a semiconductor device, comprising:
    forming a first oxide layer over a portion of a semiconductor substrate formed from a first semiconductor material having a first conductivity type such that a remaining portion of the semiconductor substrate is exposed;
    forming a protective layer on a first surface of the semiconductor substrate and the first oxide layer;
    introducing a dopant of the second conductivity type into the semiconductor substrate through the protective layer to form a junction layer that defines a junction with the semiconductor substrate;
    forming a first conductive layer over the junction layer; and
    forming a second conductive layer on a second surface of the semiconductor substrate opposing the first surface of the semiconductor substrate.

2. The method of claim 1 wherein the protective layer comprises a conductive material.

3. The method of claim 2 wherein the protective layer comprises polysilicon.

4. The method of claim 1 further comprising removing the protective layer after introducing the dopant of the second conductivity type.

5. The method of claim 4 wherein the protective layer comprises a non-conductive material.

6. The method of claim 1 further comprising diffusing the dopant implanted in the semiconductor substrate at an elevated temperature.

7. The method of claim 1 wherein the dopant is introduced into the semiconductor substrate by ion implantation.

* * * * *